US009646689B2

United States Patent
Bedeschi et al.

(10) Patent No.: US 9,646,689 B2
(45) Date of Patent: *May 9, 2017

(54) REFRESH ARCHITECTURE AND ALGORITHM FOR NON-VOLATILE MEMORIES

(71) Applicant: Micron Technology, Inc., Boise, ID (US)

(72) Inventors: Ferdinando Bedeschi, Biassono (IT); Roberto Gastaldi, Agrate Brianza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/753,938

(22) Filed: Jun. 29, 2015

(65) Prior Publication Data

US 2015/0302924 A1 Oct. 22, 2015

Related U.S. Application Data

(63) Continuation of application No. 13/513,139, filed as application No. PCT/IT2009/000541 on Dec. 2, 2009, now Pat. No. 9,070,473.

(51) Int. Cl.
| | | |
|---|---|---|
| *G11C 11/00* | (2006.01) | |
| *G11C 13/00* | (2006.01) | |
| *G11C 16/34* | (2006.01) | |
| *G06F 11/10* | (2006.01) | |
| *G11C 14/00* | (2006.01) | |

(Continued)

(52) U.S. Cl.
CPC ...... *G11C 13/0033* (2013.01); *G06F 11/1068* (2013.01); *G11C 13/0004* (2013.01); *G11C 13/004* (2013.01); *G11C 13/0061* (2013.01); *G11C 13/0069* (2013.01); *G11C 14/009* (2013.01); *G11C 16/3418* (2013.01); *G11C 29/52* (2013.01); *G11C 11/5678* (2013.01)

(58) Field of Classification Search
CPC ..................... G11C 11/4094; G11C 11/4076
See application file for complete search history.

(56) References Cited

U.S. PATENT DOCUMENTS

| | | |
|---|---|---|
| 5,732,092 A | 3/1998 | Shinohara |
| 6,151,246 A | 11/2000 | So et al. |

(Continued)

FOREIGN PATENT DOCUMENTS

| | | |
|---|---|---|
| CN | 1462038 A | 12/2003 |
| CN | 102834870 A | 12/2012 |

(Continued)

OTHER PUBLICATIONS

"Chinese Application Serial No. 200980163283.9, Office Action mailed Aug. 22, 2014", 13 pgs.

(Continued)

*Primary Examiner* — Richard Elms
*Assistant Examiner* — Mohammed A Bashar
(74) *Attorney, Agent, or Firm* — Schwegman Lundberg & Woessner, P.A.

(57) ABSTRACT

Methods and systems to refresh a nonvolatile memory device, such as a phase change memory. In an embodiment, as a function of system state, a memory device performs either a first refresh of memory cells using a margined read reference level or a second refresh of error-corrected memory cells using a non-margined read reference level.

20 Claims, 9 Drawing Sheets

(51) Int. Cl.
  *G11C 29/52* (2006.01)
  *G11C 11/56* (2006.01)

(56) References Cited

U.S. PATENT DOCUMENTS

| | | |
|---|---|---|
| 9,070,473 B2 | 6/2015 | Bedeschi et al. |
| 2007/0279996 A1 | 12/2007 | Rolandi et al. |
| 2007/0280023 A1 | 12/2007 | Happ et al. |
| 2008/0068912 A1 | 3/2008 | Lee |
| 2008/0117704 A1 | 5/2008 | Happ et al. |
| 2008/0175054 A1 | 7/2008 | Hancock et al. |
| 2013/0003451 A1 | 1/2013 | Bedeschi et al. |

FOREIGN PATENT DOCUMENTS

| | | |
|---|---|---|
| DE | 112009005413 T5 | 10/2012 |
| JP | 09027199 A | 1/1997 |
| JP | H9027199 A | 1/1997 |
| JP | 09204367 A | 8/1997 |
| JP | H9204367 A | 8/1997 |
| JP | 09320300 A | 12/1997 |
| JP | H9320300 A | 12/1997 |
| JP | 11154394 A | 6/1999 |
| JP | 2000235524 A | 8/2000 |
| JP | 2003507840 A | 2/2003 |
| JP | 2005135488 A | 5/2005 |
| JP | 2008071473 A | 3/2008 |
| JP | 2008165955 A | 7/2008 |
| TW | 201145287 A | 12/2011 |
| WO | WO-9629704 A1 | 9/1996 |
| WO | WO-2009012204 A1 | 1/2009 |

OTHER PUBLICATIONS

"International Application Serial No. PCT/IT2009/00541, International Search Report mailed Mar. 8, 2010", 3 pgs.

"Japanese Application Serial No. 2012-541630, Office Action mailed Aug. 20, 2013", 4 pgs.

"Japanese Application serial No. 2012541630, Response filed Nov. 11, 2013 to Office Action Mailed Aug. 20, 2013", (Nov. 11, 2013), 10 pgs.

REFRESH ARCHITECTURE AND ALGORITHM FOR NON-VOLATILE MEMORIES

TECHNICAL FIELD

Embodiments of the invention are in the field of non-volatile memory devices, and more specifically pertain to refreshing of phase-change memory devices.

BACKGROUND

As known, phase-change memory (PCM) arrays use a class of materials which have the property of changing between two phases having distinct electrical characteristics. Chalcogenides, for example, may change from a disordered amorphous phase to an ordered crystalline or polycrystalline phase. The two phases are associated to considerably different values of resistivity which may be sensed and associated with different memory states. In particular, a phase-change memory cell may be defined as "set" when, under appropriate biasing, a detectable current is conducted (e.g., a condition typically associated to a logic state "1"), and as "reset" when, under the same biasing, a much lower current is conducted (e.g., logic state "0").

The phase change may be obtained by increasing the temperature. Nucleation occurs if the phase change material is kept at the crystallization temperature, for example, above about 200° C., for a sufficient length of time. If a system application exposes a PCM array to ambient temperatures approaching the crystallization temperature for a sufficient amount of time, memory retention errors can occur when data corresponding to the amorphous state is lost. Such retention errors may preclude the use of PCM in high temperature applications absent a material improvement or a burdensome level of error correction code (ECC). For example, many automotive applications may specify non-volatility at over 150° C. with data retention targeting 10, or even 20, years in demanding applications.

A PCM memory providing improved data retention at temperature ranges over 100 C is therefore advantageous.

BRIEF DESCRIPTION OF THE DRAWINGS

Embodiments of the invention are particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of embodiments of the invention. However, it will be understood by those skilled in the art that other embodiments may be practiced without these specific details. In other instances, well-known methods, procedures, components and circuits have not been described in detail so as not to obscure the present invention. Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, levels, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

Methods and systems to refresh non-volatile memory cells as a function of system state and/or as a function of system temperature are described herein. In particular embodiments, a memory controller unit executes a refresh algorithm with suspend and resume capabilities as a function of different temperatures and different system states. In certain embodiments, the type of refresh performed on the non-volatile memory varies with the state of the system such that an intensive refresh is performed while the system is in a state where system components do not access the memory and refreshes incurring small latencies are performed while the system is in a state where system components access the memory. Triggering of these distinct refresh types may be further tailored for the particular states based on system timers and temperatures to provide the non-volatile memory with an extended operating temperature range. While the exemplary embodiments describe herein provide particular details in the context of phase change memory (PCM) devices, one of ordinary skill in the art will appreciate that even though the temperature sensitivity of PCM devices may not be present in devices of other memory technologies, such the state dependent refresh methods and systems described herein may nonetheless be adapted to other non-volatile memory technologies, such as MRAM, Flash, etc.

Figure 1:
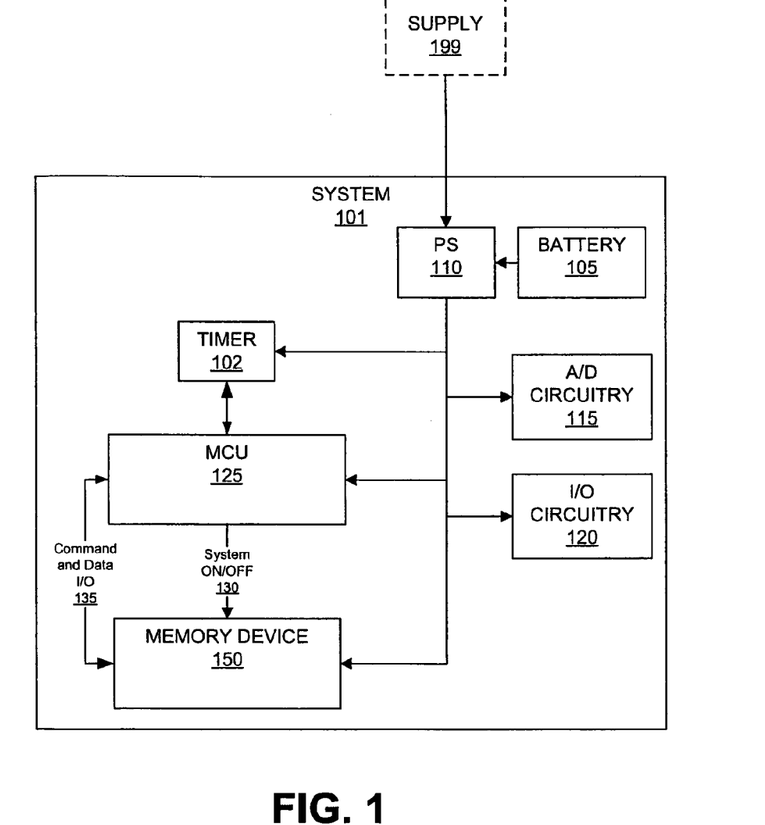
FIG. 1 is a block diagram illustrating certain components in a system configured to perform memory refresh as a function of system state, in accordance with an embodiment of the present invention.

FIG. 1 is a block diagram illustrating certain components in a system 101 including a non-volatile memory device 150 and a memory controller unit (MCU) 125. The memory device 150 may be used to store instructions that are executed by one or more components of the system 101 during the operation of system 101, and may also be used to store data operated upon or communicated to/from the system by one or more components of the system 101. The memory device 150 and the MCU 125 are configured to initiate refreshes of the non-volatile memory cells in the memory device 150 as a function of system state, in accordance with embodiments of the present invention. Refreshes initiated by the memory device 150 are referred to herein as "self-activated" and refreshed initiated by the MCU 125 are referred to herein as "command activated." As shown, the system 101 includes a system power supply unit 110 coupled to an external power supply 199, which may be, for example, a 12V automotive battery or a power mains. The system power supply unit 110 may be further coupled to an auxiliary system battery 105 which may be utilized by the system 101 for either during normal system operation or for system maintenance while in a deep power down (DPD) state. For example, any of the memory refresh operations may be performed while the system 101 is in a DPD state with the memory device 150 powered only by battery 105. In the DPD state, any of the components, 115, 120, 125, etc. of the system may be powered down. Where the MCU 125 is powered down, then the memory device 150 relies on self-activated refreshes. Where the MCU 125 remains powered up in a system DPD state, memory refreshes may be triggered either by a refresh command issued from the MCU 125 or by the memory device 150 itself, through self-activated refresh logic.

The system 101 further includes A/D circuitry 115 and I/O circuitry 120 for sensing, control, and communication with devices external to the system. Each of the A/D circuitry 115 and I/O circuitry 120 are coupled to the power supply unit 110 via a power bus and further coupled by one or more data bus to each other and to the memory device 150 via the MCU 125. The MCU 125 is communicatively coupled to the memory device 150 through a command interface and data I/O 135. The MCU 125 is also coupled to a timer 102 utilized for periodically triggering a particular type of memory refresh (e.g., as dependent on the system state) and further provides a dedicated system-on/system-off signal 130 to the memory device 150 to communicate system state information beyond the active state 210 and standby state 220 (FIG. 2) which are typically determined via a chip enable (CEB) selection. As discussed further elsewhere herein, the system-on/system-off signal 130 is for determining a system state transition upon which a particular type of memory refresh will be triggered.

Figure 2:
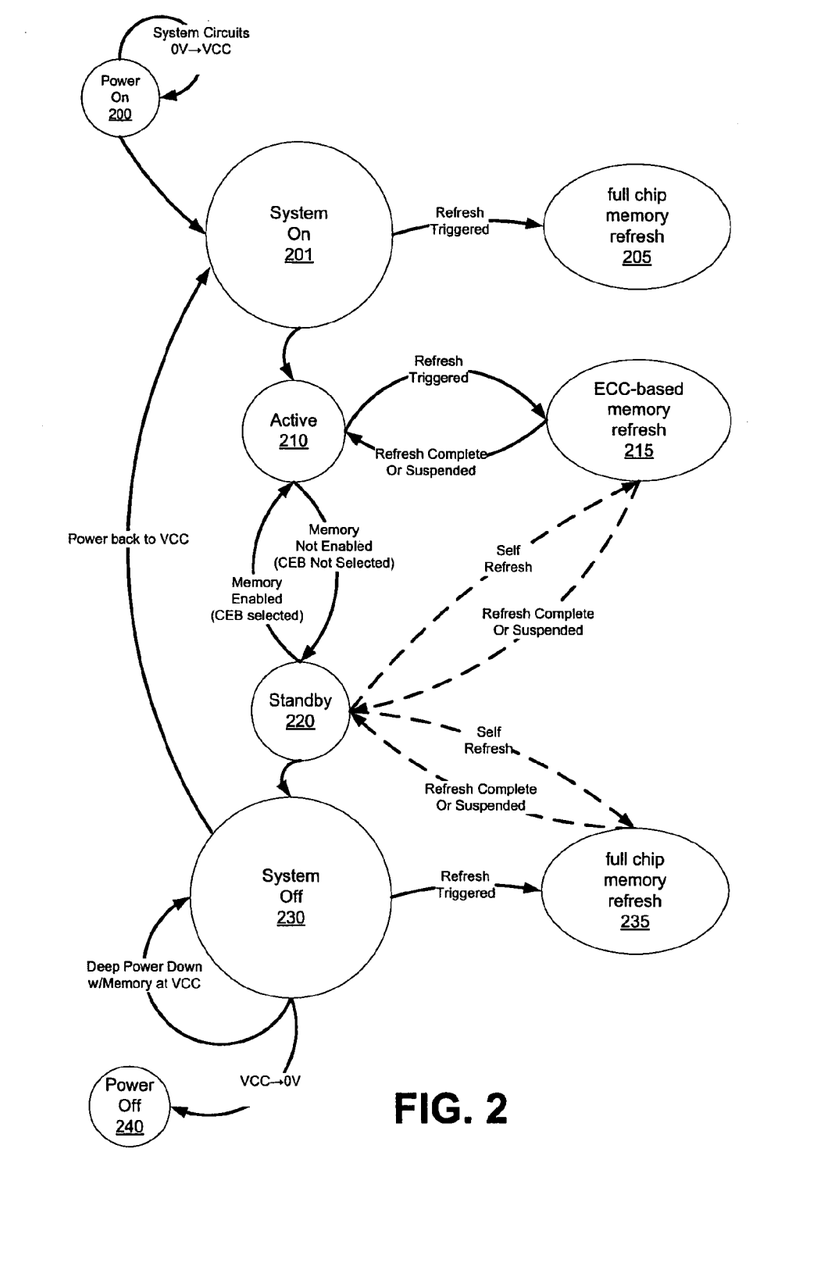
FIG. 2 illustrates a state diagram illustrating states of a system and non-volatile memory refreshes performed as a function of the system states, in accordance with an embodiment of the present invention.

FIG. 2 illustrates a state diagram illustrating states of a system and non-volatile memory refreshes performed as a function of the system states, in accordance with an embodiment of the present invention. As shown, during a power-on state 200, every circuit of a system, such as system 101, including the non-volatile memory device 150 is powered up from 0V to Vcc. As conventional in the art, during the power-on state 200, logic gates of the system 101 are systematically brought from a "don't care" state to a deterministic state. Depending on the embodiment, the power-on state 200 may be entered only when Vcc is supplied for a first time with an uninterruptable power supply to power the system 101 thereafter.

As further shown in FIG. 2, with all circuits powered up, a system-on state 201 is entered. In an embodiment, a system-on state identifier triggers the memory device 150 to perform memory refresh 205. In the context of a non-volatile device (e.g., a PCM device), a refresh is not merely a reading and a rewriting of that which was read as might be performed in a volatile memory device (e.g., DRAM). Instead, a non-volatile device refresh entails a read against a threshold level and a reprogramming of any bits which to not satisfy the read criteria relative to the threshold level. As discussed further elsewhere herein, with the memory refresh 205 every memory cell of the memory device 150 is read against a margined reference level and any of cells failing the margined reference level are reprogrammed. The full chip memory refresh 205 is therefore an intensive process which may require anywhere from a few hundred milliseconds (ms) to as much as 10 seconds or more, depending on the data pattern, memory cell technology, memory device architecture and size.

In the system-on state 201, all circuits in the system 101 including the non-volatile memory device (i.e., memory chip) are at Vcc. Generally, while in the system-on state 201 the memory device 150 will not be accessed and therefore the relatively intensive memory refresh 205 can be performed. For initiating the refresh 205, the system-on state 201 may be differentiated from the power-on state 200 by a state identifier communicated to the memory device 150. In one embodiment, a dedicated "system-on" signal 130 may be supplied by the memory controller unit (MCU) and upon receiving the system-on signal, the memory device 150 may initiate the memory refresh 205. Because the memory device 150 is configured to perform multiple types of distinct refreshes, the presence of "system-on" signal 130 may serve to further indicate to the memory device 150 the particular type of refresh to be performed (e.g., refresh 205 is a full-chip intensive refresh) without requiring the MCU 125 to issue refresh commands that differentiate between multiple types of refresh. The system-on signal also enables the memory device 150 to perform the full chip memory refresh 205 as a self-activated refresh triggered by the state transition even in absence of any specific "refresh" command being issued by the MCU 125 through the command interface 135. For either command activated or self-activated embodiments, in the example illustrated in FIG. 2, the full chip memory refresh 205 is initiated every time the system 101 transitions to the system-on state 201.

In alternative embodiments, the chip enable (CEB) signal may also be utilized to define the system-on state 201 for triggering and specifying the refresh type to be performed by the memory device 150. For example, CEB could be a global signal enabling the active mode of the whole system which includes non-volatile-memory. For embodiments having the dedicated "system-on" signal 130, CEB may be in either a "selected" state or in the "not selected" state. In still other embodiments where the power-on state 200 is entered only when Vcc is supplied for a first time, the system-on state need only be differentiated from an active state and a standby state for the purposes of specifying either an intensive memory refresh or an ECC-based, low-latency refresh.

FIG. 2 further illustrates an "active" state 210 during which all system circuits are powered to Vcc, the memory device is enabled (CEB selected), and the memory device is being accessed by the MCU 125. In the exemplary embodiment depicted, when in the active state 210, upon receiving a refresh command from the MCU 125 or upon a trigger event occurring internally to the memory device 150, the memory device 150 performs an ECC-based memory refresh 215, rather than an intensive margined refresh (e.g., memory refresh 205). As described further elsewhere herein, in contrast to the full chip memory refresh 205, the ECC-based memory refresh 215 is performed against a read level threshold and is less intensive than the margined memory refresh 205 in that only error corrected memory cells are refreshed (e.g., at the ppm level). The memory refresh 215 induces very little or no memory latency. In certain embodiments, while in the active state 210, the ECC-based memory refresh 215 may also be suspended to service the MCU's memory access requests.

In a "standby" state 220, the memory device 150 is not enabled (CEB not selected) and the MCU 125 is not accessing the memory device 150, however all system circuits remain powered to Vcc. In a particular embodiment, because the standby state 220 may be of relatively short duration depending on the standby to active specification of the memory device 150, the memory device 150 is configured to perform the ECC-based memory refresh 215 (either MCU command activated or self-activated) while memory device 150 is in the standby state 220. However, as illustrated in FIG. 2, as an option which may or may not be exercised (as denoted in FIG. 2 by the dashed lines), the full chip memory refresh 235, rather than the ECC-based memory refresh 215 may be performed upon the memory device 150 receiving a refresh command from the MCU 125 while the memory device 150 is the standby state 220. As previously described, the memory refresh 215 is suspendable in response to a refresh suspend command issued by the MCU 125. Similarly, if the memory refresh 235 is to be performed during the standby state 220, that refresh algorithm is also to be suspendable (in which case so would be the memory refresh 205) either in response to a state transition back to the active state 210 or via a suspend command from the MCU 125. For suspendable refresh embodiments, the memory device 150 may continue a suspended refresh upon returning to the standby state, for example in response to a "resume" command issued by the MCU 125.

In the "system-off" state 230 most circuits of the system 101 are powered down, for example in a DPD state. In the system off state 230, the memory device 150 remains powered to Vcc, for example by battery 105. In particular embodiments, the MCU 125 also remains powered to Vcc. For the exemplary embodiment, the system-on signal 130 may be inverted to identify the "system-off" state. In the exemplary embodiment, a transition to the system-off state 230 triggers the full chip memory refresh 235 which is substantially the same as the memory refresh 205 performed upon entering the system-on state 201. The memory refresh 235 is most useful for applications where the system 101 may be powered down for extended periods of time during which the memory device 150 may experience retention failures prior to performance of the memory refresh 205 upon entering the system on state 201. Distinguished from the system off state 230, in the "power off" state 240, all circuits of system 101, including the memory device 150 and MCU 125 are powered down to 0V.

Figure 3:
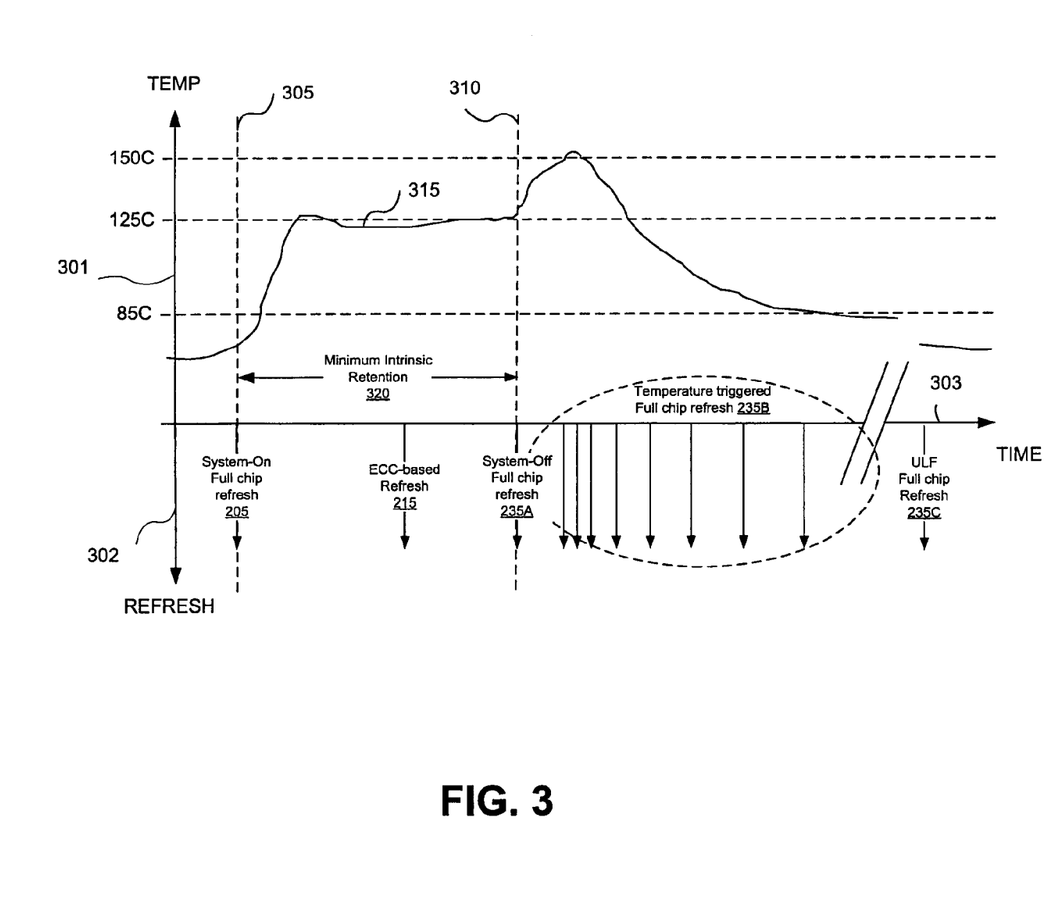
FIG. 3 depicts memory refresh operations performed as a function of system state and as a function of a system or memory device temperature, in accordance with an embodiment of the present invention.

FIG. 3 is an example of memory refresh operations performed as a function of the system states depicted in FIG. 2 and as a function of a system temperature. In the exemplary embodiment depicted in FIG. 3, the system 101 is utilized in an automotive application in which temperatures may enter into an extended range for the non-volatile memory device 150. In FIG. 3, a temperature axis 301 is aligned over a memory refresh axis 302 with a system temperature 315 and refresh events presented as a function of time denoted by the time axis 303.

At time 305, the system 101 enters the system-on state 201 (e.g., automobile ignition is actuated turning an engine on), and, in response, the full chip memory refresh 205 is performed. The system then transitions to the active state 210 and with the automobile engine running, the system temperature 315 increases from ambient temperature to approximately 125° C. While in the active state 210, a single ECC-based refresh 215 is performed and at time 310 the system-off state 230 is entered (e.g., automobile ignition is actuated turning the engine off). In this example, the automobile engine is running for a duration between the time 305 and the time 310 and it may be known that this duration will necessarily be less than a minimum intrinsic memory retention time 320 for the operating temperature. For example, an automobile's refueling requirements may limit the duration between time 305 and time 310 to less than 12 hours thereby defining the memory device's minimum intrinsic retention 320. Upon turning the engine off at time 310, the system enters the system-off state 230, triggering the system-off full chip refresh 235A. With the automobile engine off at time 310, the system temperature 315 continues to rise for a period in absence of active cooling. In response to the increasing system temperature 315, repetitive full-chip refreshes 235B continue (command activated or self-activated) while in the system-off state at a memory refresh frequency dependent on the temperature 315. Finally, after the system returns to ambient temperatures, the frequency of full-chip refresh rate reaches an ultra-low frequency triggered, for example, based on the timer 102, until the system enters the power-off state 240 or returns to the system-on state 201.

Figure 4A:
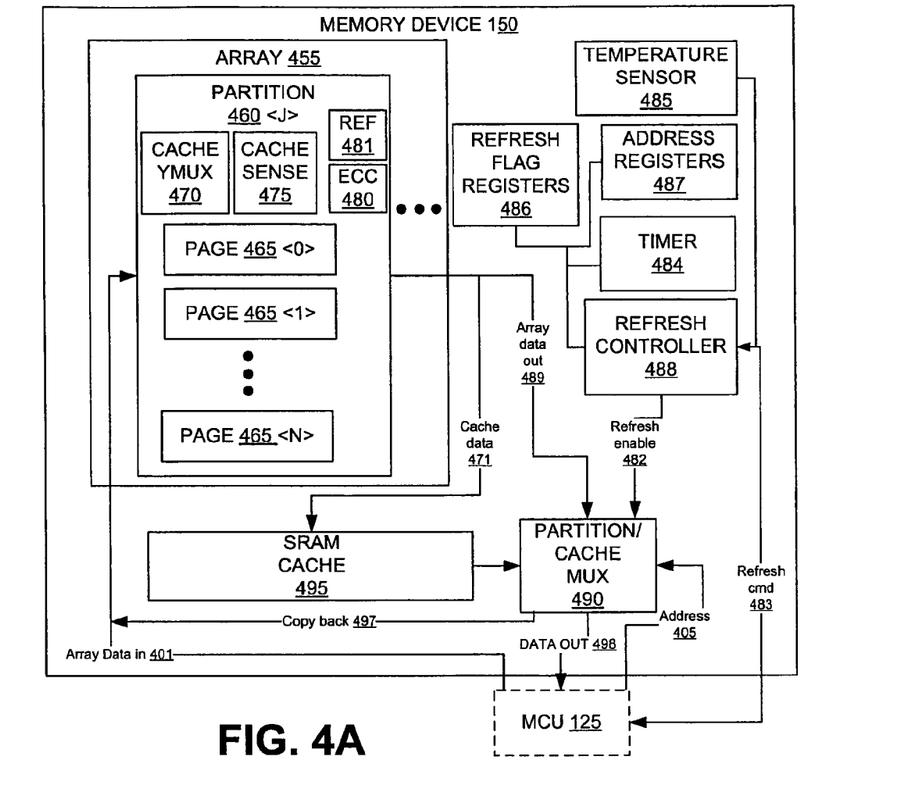
FIG. 4A is a block diagram illustrating certain components in a memory device configured to perform memory refresh as a function of system state and temperature, in accordance with an embodiment of the present invention.

FIG. 4A is a block diagram illustrating certain components in the memory device 150, in accordance with an embodiment of the present invention. With reference to FIG. 4A, the memory device 150 includes an array of data cells 455, arranged in rows and columns, and organized in a plurality of pages 465 within a plurality of partitions 460, that are structurally identical to one another. All cells of each page 465 may be read in a single read operation. In the exemplary embodiment, each of the cells in the array 455 is a phase change memory cell containing a phase change material as further depicted in FIG. 7.

Each partition 460 includes an error correction module (ECC) 480. Data stored in the array 455 are encoded according to a known Error Correction Code and include parity bits stored in parity cells. Data retrieved from the array 455 are sent to the error correction module 480. Data cells and parity cells may be read simultaneously. The level of error correction may vary depending on the implementation, however in the exemplary embodiment, the error correction module 480 is configured to restore a single bit error in each page 465 of read data.

The memory device 150 includes an SRAM cache 495 coupled to the array 455 via the cache data in bus 471 to read data in from the array 455 during the ECC-based memory refresh 215. The size of the SRAM cache 495 may vary depending on the implementation, but will generally range from one up to N pages (i.e., equal to the size of a full partition 460). The SRAM cache 495 and the array 455 are coupled to a partition/cache multiplexer (mux) 490. The partition/cache mux 490 selects between the cache 495 and array 455 as a function of a refresh enable signal 482 issued by a refresh controller 488 and as a function of whether the address of cells in the array 455 to be read during a read operation match those being refreshed (as stored in the address register 487). The partition/cache mux 490 is further coupled to a data bus 489 coupled to the partition 460 to collect data read out from data cells of the array 455. Data from either the cache 495 or the array 455 is the read out of the memory device 150 via the data out bus 498. Data to be stored in the memory array 455 during a program operation is provided via the data in bus 401 coupled to the partition 460. The partition/cache mux 490 is coupled to the data in bus 401 via the copy back bus 497 to allow data read from the SRAM cache 495 to be copied back to the partition 460 during the ECC-based memory refresh 215.

The refresh controller 488 manages the memory refresh operations of the memory device 150. The refresh controller 488 is coupled via the memory device I/O interface to the MCU 125 via the refresh command bus 483 and is responsive to refresh activate, refresh suspend, and refresh resume commands issued by the MCU 125. In certain embodiments, the refresh controller 488 may further include logic for triggering self-activated refreshes of the memory device 150 in response to output from the internal timer 484 or in response to output from the temperature sensor 485 (e.g., initiating refresh operations in absence of a command from the MCU 125). The temperature sensor 485 may of course also be located external to the memory device 150 and utilized by the MCU 125 for the purposes of issuing refresh commands to the refresh controller 488.

Refresh flag registers 486, coupled to the refresh controller 488, store refresh status flag bits utilized by the refresh controller 488 in management of memory refresh operations. Exemplary status flags include, but need not be limited to, "chip busy," "refresh on-going," and "refresh needed." One or more of the refresh flag bits may be read by the MCU 125 before any memory access. The MCU 125 may also issue refresh commands (e.g., activate, suspend, resume) in response to reading the refresh flag status bits to modify the refresh status according to system needs. Address registers 487, also coupled to the refresh controller 488, store addresses of the array 455 which have been refreshed and/or not yet refreshed. In a particular embodiment, the last address of a subset of memory cells in the array 455 which have been refreshed is stored in the address registers 487.

Figure 4B:
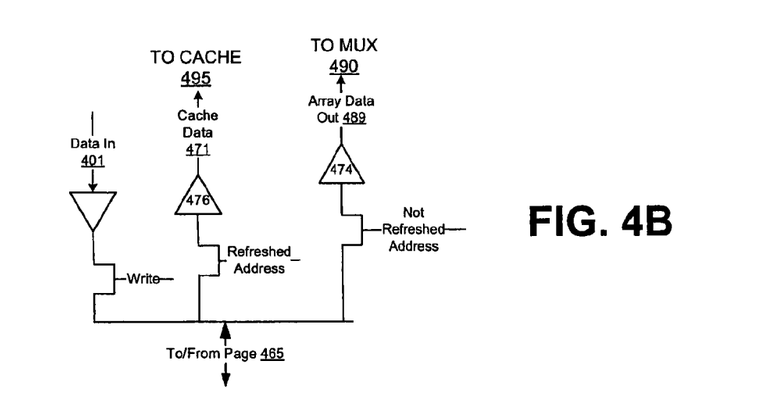
FIG. 4B is a schematic diagram illustrating circuit pathways between a non-volatile memory page, a volatile cache, and an exterior of the memory device, in accordance with an embodiment of the present invention.

As known in the art each partition 460, includes read/program circuits and column decoding (Y-mux) circuits for the data cells and are not shown in FIG. 4A, for simplicity. The partition 460 also includes read reference current, voltage or resistance levels, generated by dedicated circuits that may include reference cells 481 which include one or more margined reference levels R1, R2, etc. employed during a full-chip refresh in addition to a read level reference level employed during a conventional data read out. In the exemplary embodiment depicted in FIG. 4A, the memory device 150 further includes a cache Y-mux 470 and cache sense circuitry 475 for direct access to the cache 495. Duplication of the Y-mux and sense circuitry for the cache 495 provides the memory device 150 with read-while-refresh (RWR) functionality for minimal memory latency during an ECC-based refresh. For such an embodiment, as further illustrated in FIG. 4B, the memory array pages are coupled to the cache data in bus 471 through a additional cache sense amp 476 and coupled to the partition/cache multiplexer 490 via the sense amp 474. Where a memory address to be read falls in the range of addresses being refreshed (e.g., page 465 <1>), the "refreshed address" signal is enabled for a direct read from the cache 495. Where the address to be read is not within the range of addresses being refreshed (e.g., any Page 465 other than the cached page 465 <1>), the "not refreshed address" signal is enabled and data is output via the array data out 489 by way of the partition/cache multiplexer 490. The refreshed address and not refreshed address signals may, for example, be provided by the refresh controller 488.

Figure 5:
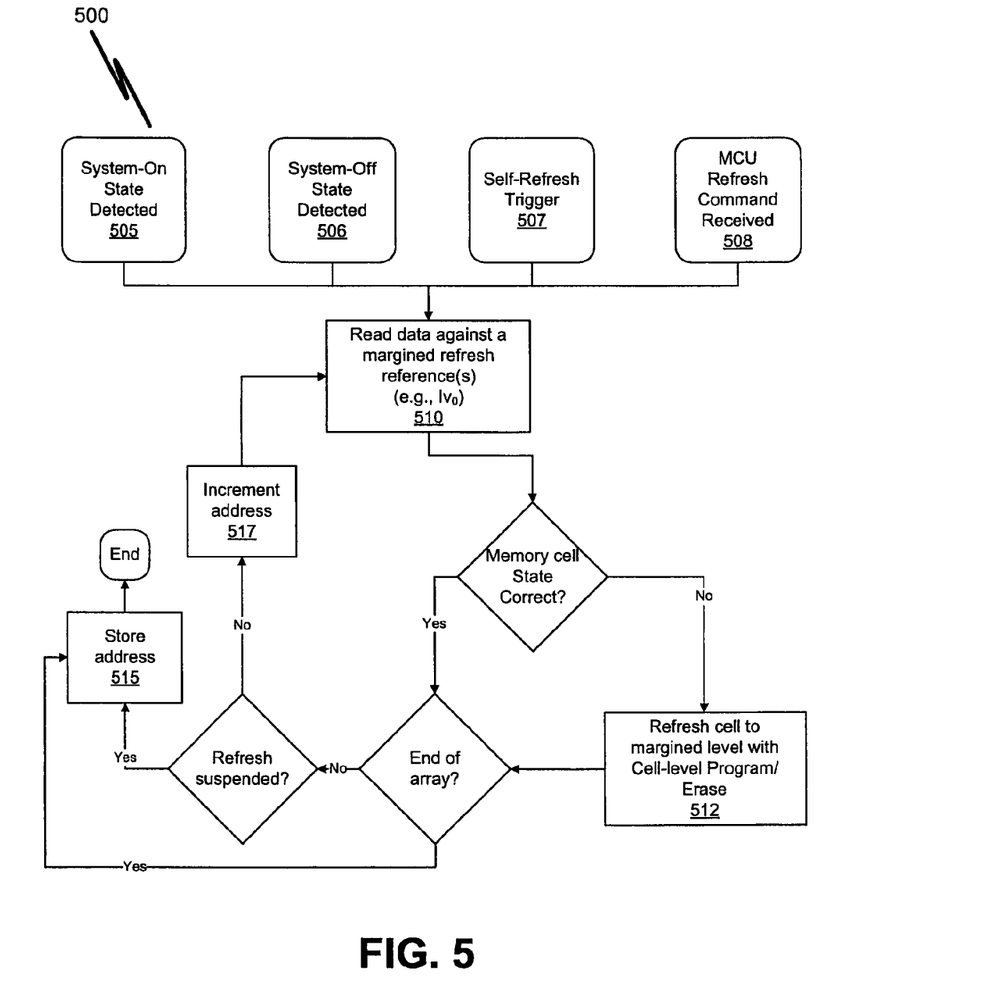
FIG. 5 depicts a flow diagram illustrating particular operations performed by a memory device during a full chip refresh, in accordance with an embodiment of the present invention.

FIG. 5A depicts a flow diagram for a method 500 illustrating particular operations performed by a memory device, during the full chip refresh 205 (235). The method 500 is initiated in response to: detecting, at operation 505, a transition to the system-on state 201 and/or detecting, at operation 505, a transition to the system-off state 230. In further embodiments, in addition to beginning the method 500 in response to entering one of these states, the method 500 may also be initiated in response to: a self-activated refresh trigger occurring at operation 507 while the memory device 150 is in the system-off state 230, (e.g., as a function of one or more of the temperature sensor 485 and timer 484 and as exemplified in FIG. 3); or receiving, at operation 508, a refresh command from the MCU 125 (e.g., "refresh activate" or "refresh resume" sent via command interface 135 while in the standby state 220). Upon initiation of method 500 may, a status bit in the refresh flag registers 486 is set to indicate a refresh is ongoing.

At operation 510, data from the array 455 is read against a margined refresh reference. The margined refresh reference level is at a more stringent threshold than is the read level during normal operation of the memory device 150. For example, for a PCM array where a read entails a current sensing and the read level of a biased cell is 7 μA, the margined read reference level ($Iv_0$) for a logical 0 employed at operation 510 is 2 μA for the same cell bias. In addition to correction of retention errors, a margined threshold for a logical 1 may also be employed at operation 510 to address cell drift. In a particular embodiment, a margined read reference level (R1), set to a first margined level below the read level reference level (R), is stored in the reference cells 481 (FIG. 4A). In a further embodiment, a margined read reference level (R2), set to a second margined level above the read level reference level (R), is stored in the reference cells 481 (e.g., for correction of drift).

If the memory fails the margined read level, then the cell state is determined to be incorrect and the method 500 proceeds to refresh the cell to the margined level with a cell-level program at operation 512. For example, in a PCM device, a cell failing the margined read reference level R1 for a logical 0 would be "reset" at the cell program operation 512. Where the memory cells passes the margined read level or after a failing cell as been refreshed, the method 500 continues the array scan by incrementing the address at operation 517 and returning to the read operation 510. All cells in the memory device 150 are cycled through until the method 500 is ended when either the last cell in the array has been read or a refresh suspend command has been received. The address of the last verified cell is stored at operation 515. For example, as previously described, embodiments which perform the full-chip refresh 235 while in the standby state 220 may need to suspend the full-chip refresh 235 upon the memory device being enabled and returning to the active state 210. The refresh scan may then continue at the stored location upon a subsequent refresh cycle. For example, method 500 may be initiated again via operations 505-508.

Figure 6A:
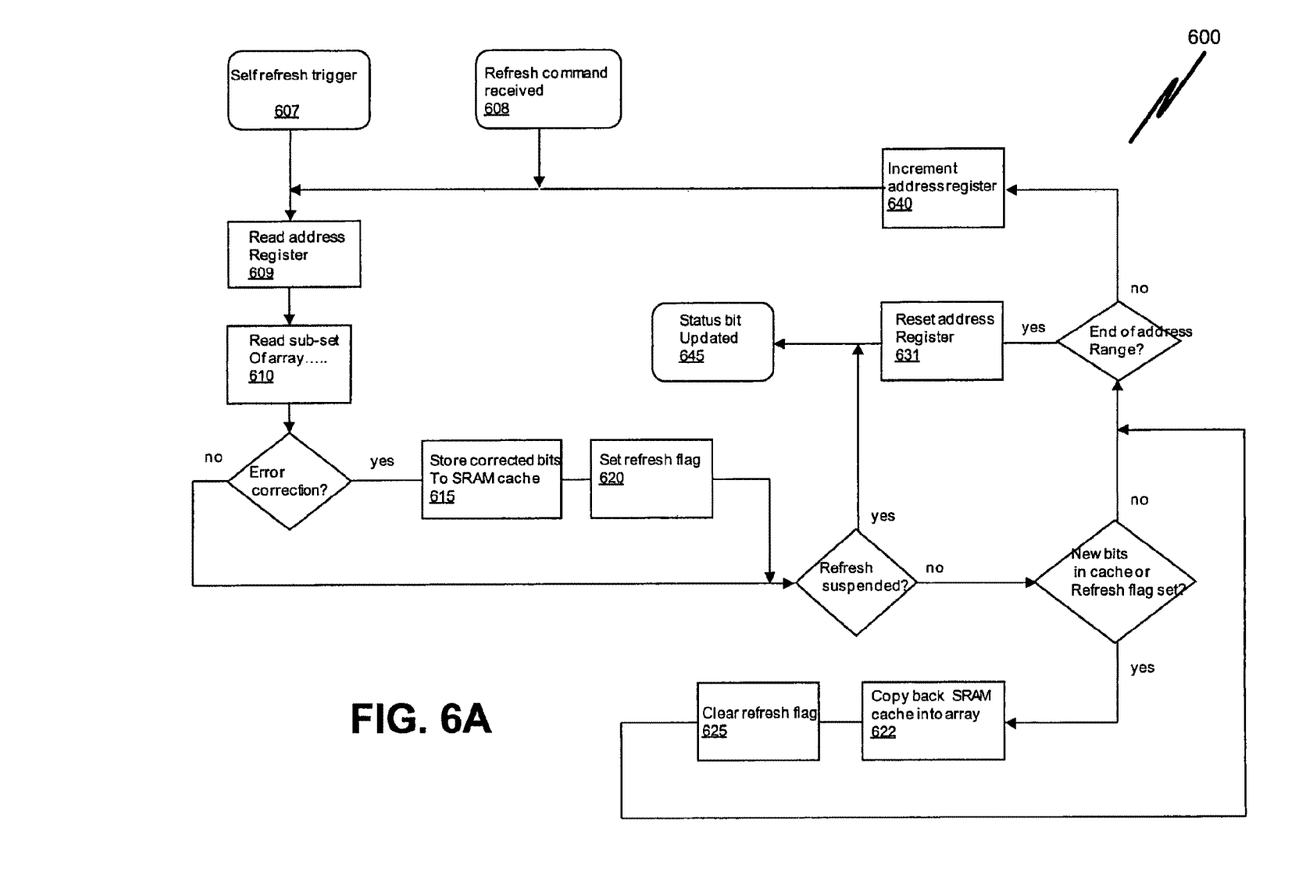
FIG. 6A illustrates a flow diagram illustrating particular operations performed by a memory device during an ECC-based refresh, in accordance with an embodiment of the present invention;, in accordance with an embodiment of the present invention.

FIG. 6A illustrates a flow diagram illustrating particular operations of a method 600 performed by a memory device during an ECC-based refresh, in accordance with an embodiment. While in the active state 210 or optionally the standby state 220, the method 600 may be initiated in response to a self-activated refresh trigger at operation 607 (e.g., as a function of one or more of the temperature sensor 485 and timer 484), or receiving, at operation 608, a refresh command from the MCU 125 (e.g., "refresh activate" or "refresh resume"), each of which causes a starting address to be loaded into the address register 487. Initiation of method 600 sets a status bit in the refresh flag registers 486 to indicate a refresh is ongoing.

At operation 609, the address stored in the address register 487 is read to determine the first address to scan. At operation 610, a subset of the array 455 beginning at the address read from the address register 487 is read into the SRAM cache 495 (e.g., via cache data in bus 471). The size of the subset read at one time varies with the implementation and is dependent on the size of the cache with larger cache sizes requiring more time to fill and potentially incurring greater latency periods. The read operation 610 is performed against the read level, not a margined reference level, and sent to the ECC module 480. Depending on the error correction level provided by the ECC module 480, one or more bits for the subset read into the cache 495 may be corrected. In the exemplary embodiment, the subset of the array 455 read into the cache 495 is one page and the ECC module 480 corrects one error bit for each page 465.

If error correction of a bit occurs, then at operation 615 the corrected bit is stored to the cache 495. At operation 620, a refresh flag register 486 is set to identify that a refresh of the array subset is required because of the correction and that the cache 495 is to be copied back into the array 455. After filling the cache, it is then determined whether a refresh suspend command was issued. As such, the suspend command will be effective after reading one subset. For example, where a single memory page of PCM cells is read, a suspend command would be effective within a approximately 50 ns (the time to read 128$b$ into cache 495). If the refresh is suspended, the method 600 exits with the status bit updated at operation 645 to indicate the memory is available for the MCU 125 to access the array (e.g., write access).

If the refresh is not suspended, then a determination is made whether new bits have been written to the cache 495 as of the time it was filled from the array 455. New bits in the cache 495 as a result of the error correction at operation 615 or a direct write of new data to the cache 495 (as described further in reference to FIG. 6B) may be identified by the refresh flag registers 486. If new bits are present, then at operation 622 the cache 495 is copied back into the memory array 455 to complete the refresh of the subset of cells read into the cache 495. The refresh flag is then cleared at operation 625 A determination is then made whether the last subset of cells read at operation 610 included the last address for the array 455. If not, the method 600 increments the address register at operation 640 and returns to the read operation 610. If the end of the memory cell address range has been reached, the method 600 is completed with the address register 487 reset so that upon initiating a subsequent scan a starting address of new subset of the array 455 may be loaded into the address register 487. The status bit is updated at operation 645 to indicate the memory is available for the MCU 125 to access the array.

Figure 6B:
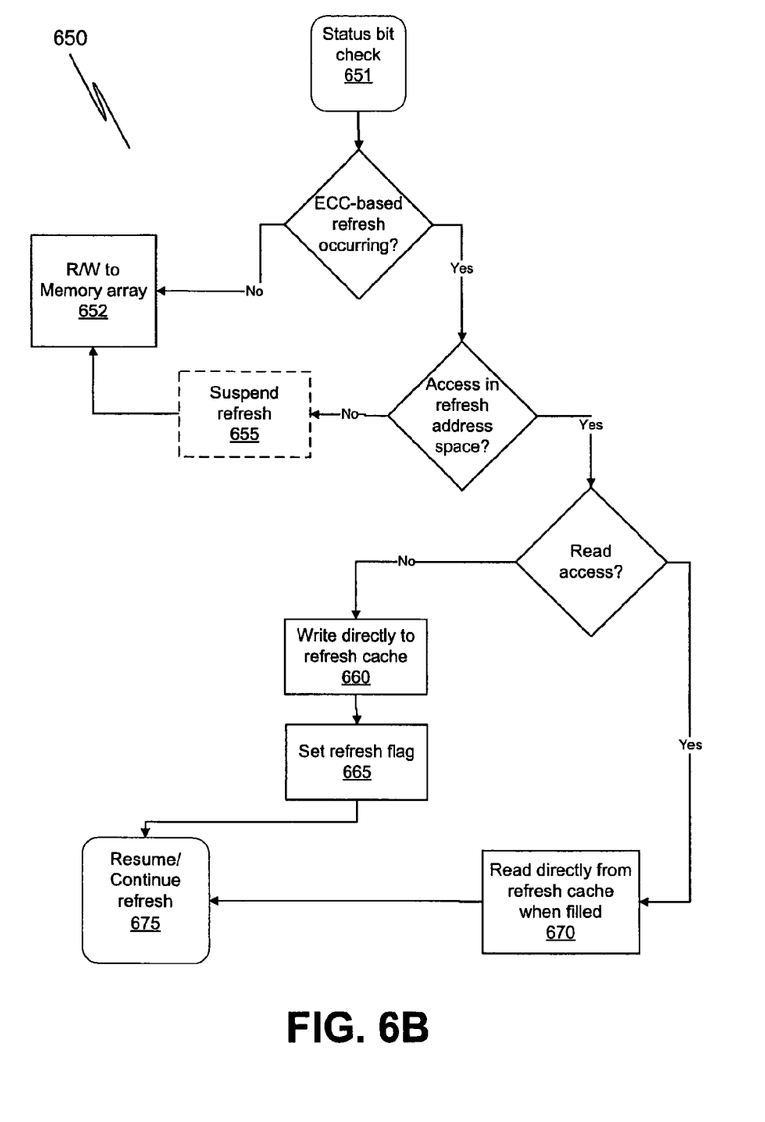
FIG. 6B illustrates a flow diagram illustrating particular operations performed by a memory device to facilitate a memory read during a memory refresh, in accordance with an embodiment of the present invention.

FIG. 6B illustrates a flow diagram illustrating particular operations of a method 650 performed by the memory device 150 to facilitate a memory read during an ECC-based memory refresh performed while in the active state (i.e., RWR). The method 650 begins at operation 651 with the MCU 125 checking the status bit of the memory device 150. If the refresh status bit indicates a refresh is not occurring, then reading/programming of the array 455 proceeds at operation 652. If however, a refresh is occurring, then the address range being accessed is compared to the addresses stored in the address registers 487. If the address range does match, then the data is read directly from the cache 495 at operation 670 or the data is written directly to the cache 495 at operation 660. Where data is written directly to the cache 495, the refresh flag is set at operation 665 to ensure the cache 495 is copied back to the array.

If the address range does not match (e.g., at least one bit address is outside the subset being refreshed), then the data is read/programmed to the array 455 at operation 652.

Where such read/reprogramming operations are addressed to pages 465 other than the one stored in the cache 495 (e.g., page 465<0>), refresh operations may be suspended at the optional operation 655 to provide the MCU 125 memory access with small latency. If the hardware supports read while refresh and/or program while refresh functions, the method 600 may continue without the suspending the refresh at operation 655 to provide essentially zero latency. In the exemplary embodiment depicted in FIG. 4A and FIG. 4B, the memory device includes duplicate cache sense circuitry 475 and cache Y-mux circuitry 470 such that data can be read from cells of the partition 460 other than those in the subset read into the cache (e.g., page 465<0>) while refresh of the cached subset (e.g., page 465<1>) continues. In other embodiments, write circuitry may also be duplicated between the partition 460 and cache 495 to allow a re-programming of cells in the partition 460 other than those in the subset read into the cache 495 (e.g., page 465<0>) while refresh of the cached subset (e.g., page 465<1>) continues.

Figure 7:
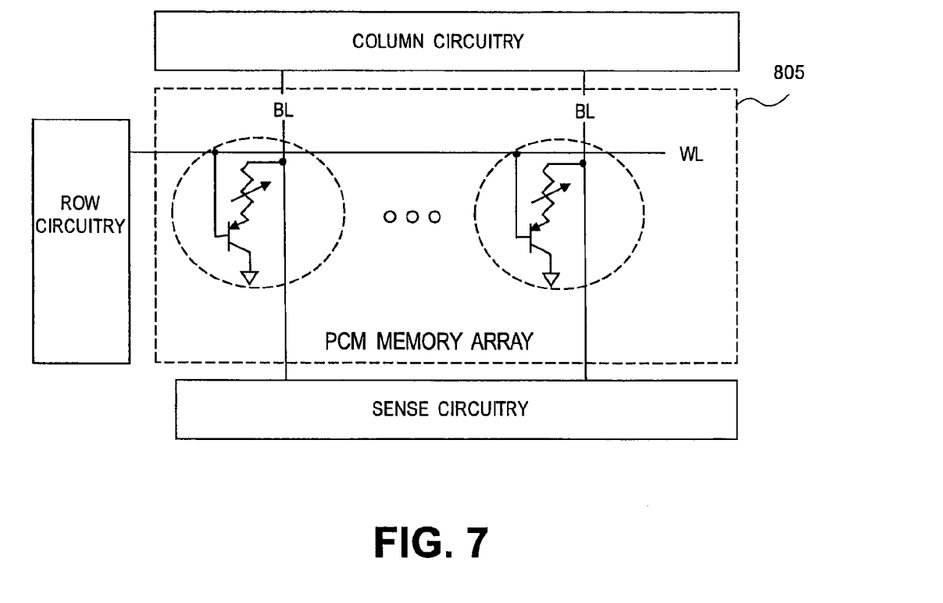
FIG. 7 is a schematic representation of a phase change memory (PCM) array which may be included in a memory device configured to perform memory refreshes, in accordance with an alternative embodiment.

FIG. 7 shows a PCM array 805. In such an embodiment, the PCM array 805 serves as the memory array partition 460 depicted in FIG. 4A. Each PCM cell includes alloys of elements of group VI of the periodic table, such as Te or Se, that are referred to as chalcogenides or chalcogenic materials. Chalcogenides may be used advantageously in phase change memory cells to provide data retention and remain stable even after the power is removed from the non-volatile memory. Taking the phase change material as $Ge_2Sb_2Te_5$ for example, two phases or more are exhibited having distinct electrical characteristics useful for memory storage.

PCM array 805 includes memory cells each having a selector device and a memory element. Although the array is illustrated with bipolar selector devices, alternative embodiments may use CMOS selector devices or diodes. By using any method or mechanism known in the art, the chalcogenic material may be electrically switched between different states intermediate between the amorphous and the crystalline states, thereby giving rise to a multilevel storing capability. The cells of PCM array 805 may therefore be operable in either single-bit per cell mode or multiple-bit per cell mode.

To alter the state or phase of the memory material, this embodiment illustrates a programming voltage potential that is greater than the threshold voltage of the memory select device that may be applied to the memory cell. An electrical current flows through the memory material and generates heat that changes the electrical characteristic and alters the memory state or phase of the memory material. By way of example, heating the phase-change material to a temperature above 900° C. in a write operation places the phase change material above its melting temperature ($T_M$). Then, a rapid cooling places the phase-change material in the amorphous state that is referred to as a reset state where stored data may have a "1" value.

On the other hand, to program a memory cell from reset to set, the local temperature is raised higher than the crystallization temperature (Tx) for a relatively longer time to allow crystallization to complete. Thus, the cell can be programmed by setting the amplitude and pulse width of the current that will be allowed through the cell.

In a read operation, the bit line (BL) and word line (WL) are selected and an external current is provided to the selected memory cell. To read a chalcogenide memory device, the current difference resulting from the different device resistance is sensed.

Figure 8:
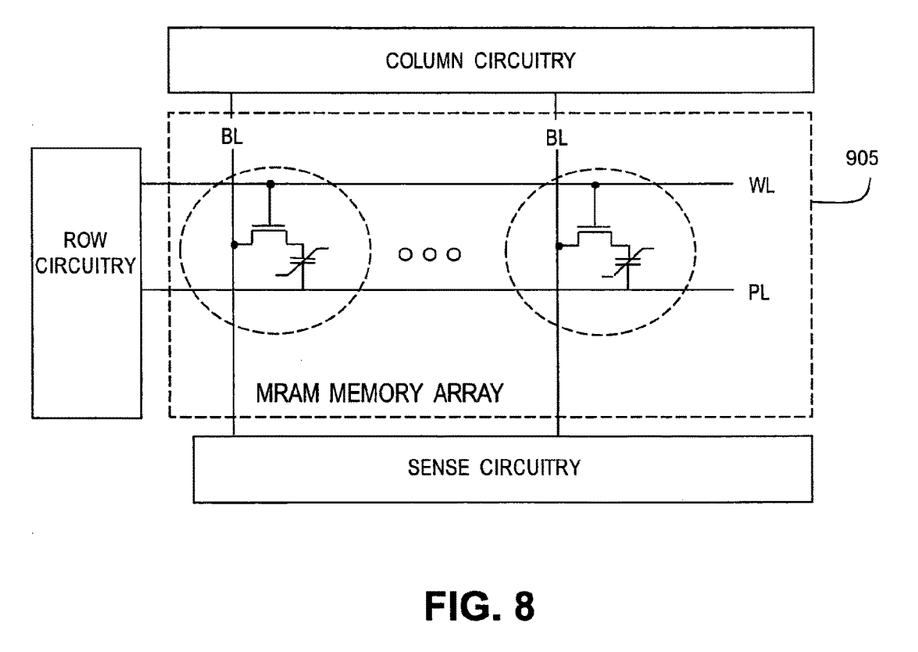
FIG. 8 is a schematic representation of an magnetic random access memory (MRAM) array which may be included in a memory device configured to perform memory refreshes, in accordance with an alternative embodiment; and It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

FIG. 8 shows a MRAM array 905 where magnetic storage elements are formed from two ferromagnetic plates located at an intersection of a row and column line and selected by a Magnetic Tunnel Junction (MTJ) device. In such an embodiment, the MRAM array 715 serves as the memory array partition 460 depicted in FIG. 4A. For such an embodiment, current imparted to the row line in one direction causes a magnetic field operative on the MRAM cell biasing the MRAM cell toward a particular state. Due to a magnetic tunnel effect, the electrical resistance of the memory cell changes based on the orientation of the fields in the two plates.

Data may be written to the memory cells using a variety of means. In the simplest, each cell lies between a pair of write lines arranged at right angles to each other, above and below the cell. When current is passed through them, an induced magnetic field is created at the junction, which the writable plate picks up. Other approaches known in the art, such as the toggle mode, spin-torque-transfer (STT) or Spin Transfer Switching, spin-aligned ("polarized") may be used to directly torque the domains.

Reading data stored in a memory cell is accomplished by measuring the electrical resistance of the cell. A particular cell is selected by powering an associated transistor which switches current from a supply line through the cell to ground. Due to the magnetic tunnel effect, the electrical resistance of the cell changes due to the orientation of the fields in the two plates. By measuring the resulting current, the resistance inside the selected cell is determined, and from this the polarity of the writable plate.

Thus, systems and methods of a state dependent non-volatile memory refresh have been disclosed. Although embodiments of the present invention have been described in language specific to structural features or methodological acts, it is to be understood that the invention is defined in the appended claims and is not necessarily limited to the specific features or embodiments described.

What is claimed is:

1. A method of refreshing a memory cell array in a non-volatile memory device, the method comprising:
 performing a first refresh and second refresh, wherein performing the first refresh further comprises:
  reading cells of the memory array against a first refresh reference level and reprogramming those cells which fail; and
 wherein performing the second refresh further comprises:
  reading cells of the memory array against a second refresh reference level that is different from the first refresh reference level and reprogramming those cells which store data corrected by an error correction encoding algorithm;
 reading data from a first subset of memory cells; and
 applying the error correction algorithm to the data read from the first subset of memory cells.

2. The method as in claim 1, further comprising reading data from the memory array out of the memory device against a read reference level, wherein there is a margin between the first refresh reference level and the read reference level, and wherein the second refresh reference level is equal to the read reference level.

3. The method as in claim 1, wherein the at least one of the first refresh and second refresh are performed repetitively at a frequency which is a function of a temperature of the memory device.

4. The method as in claim 1, wherein the first refresh is performed upon transition to a system-on state and wherein the second refresh is performed during an active state, the memory device being enabled and accessed by a memory controller unit when in the active state and the system-on state being a transition state, having all system circuits powered, between a power-on state, where system circuits are powering up, and the active state.

5. The method as in claim 1, wherein the performing of the second refresh further comprises:
   writing the error corrected data into a volatile cache memory; and
   wherein the programming comprises copying the error corrected data from the cache memory back into the first subset of memory cells.

6. The method as in claim 5, further comprising:
   receiving a system request to read a data bit out of the memory device while performing the second refresh;
   reading the data bit out of the memory array if the data bit address is in a second subset of memory cells different from the first subset of memory cells;
   reading the data bit out of the cache memory if the data bit address is in the first subset of memory cells.

7. The method as in claim 6, wherein the reading of data bit out of the memory array is with a first sense circuit and wherein the reading of the data bit out of the cache memory is with a second sense circuit.

8. The method as in claim 5, wherein the memory cells comprise phase change memory cells, wherein the volatile cache consists of SRAM cells, wherein the first subset of memory cells consists of a first page of memory cells in a memory partition and wherein the second subset of memory cells consists of a second page of memory cells in the memory partition.

9. A non-volatile memory device, comprising:
   an array of memory cells;
   a refresh controller configured to perform a first refresh and second refresh, wherein performing the first refresh further comprises:
      reading cells of the memory array against a first refresh reference level and reprogramming those cells which fail; and
   wherein performing the second refresh further comprises:
      reading cells of the memory array against a second refresh reference level that is different from the first refresh reference level and reprogramming those cells which store data corrected by an error correction encoding algorithm;
   a cache memory to store data from a first subset of the memory cells read out in response to the refresh controller initiating the second refresh; and
   an error correction encoding module to error correct the data read from the first subset of memory cells.

10. The non-volatile memory device as in claim 9, further comprising:
    a flag bit register to store a flag value in response to an error correction of the data read from the subset of memory cells; and
    a multiplexer coupled to the cache memory and the memory array to copy the error corrected data from the cache memory back to the first subset of memory cells in response to the flag value.

11. The non-volatile memory device as in claim 10, further comprising:
    a first sense circuit coupled to the memory array;
    a second sense circuit coupled to the cache memory; and
    a sense circuit selector coupled to each of the first and second sense circuits and operable to select one of the first and second sense circuits as a function of an address to be read out from the memory device, wherein the second sense circuit is selected in response to the address being within the first subset of memory cells.

12. The non-volatile memory device as in claim 11, wherein the first sense circuit is selected in response to the address being within a second subset of memory cells in a same memory partition as the first subset of memory cells.

13. The non-volatile memory device as in claim 12, wherein the memory cells comprise phase change memory cells, wherein the cache memory comprises an SRAM cache, wherein the first subset of memory cells comprises a first page of memory cells, the second subset of memory cells comprises a second page of memory cells, and wherein the error correction encoding module is configured to correct one data bit error in the first page of memory cells.

14. The non-volatile memory device as in claim 9, wherein the refresh controller is configured to suspend the performance of the second refresh in response to a command received, through a command interface of the memory device, from external to the memory device.

15. The non-volatile memory device as in claim 9, wherein the non-volatile memory device further comprises:
    a refresh timer and a temperature sensor indicative of the memory device temperature coupled to the refresh controller; wherein the refresh controller is configured to perform the first or second refresh at a frequency which is a function of the temperature sensor.

16. A system, comprising:
    a memory controller unit;
    a non-volatile memory device coupled to the memory controller unit, wherein the memory device is configured to perform a first refresh and second, wherein performing the first refresh further comprises:
       reading cells of the memory array against a first refresh reference level and reprogramming those cells which fail; and
    wherein performing the second refresh further comprises:
       reading cells of the memory array against a second refresh reference level that is different from the first refresh reference level and reprogramming those cells which store data corrected by an error correction encoding algorithm;
    a cache memory to store data from a first subset of the memory cells read out in response to the refresh controller initiating second refresh; and
    an error correction encoding module to error correct the data read from the first subset of memory cells.

17. The system as in claim 16, further comprising a plurality of circuits external to the memory device and the memory controller unit, and wherein the memory device is configured to perform the first refresh in response to the system state identifier indicating that the plurality of external circuits have been powered down.

18. The system as in claim 16, wherein the memory controller unit is configured to read a refresh status register bit of the memory device prior to accessing the memory array.

19. The system as in claim 18, wherein the memory controller unit is configured to issue a refresh suspend command to the memory device if the refresh status register bit indicates a memory refresh is occurring, and wherein the memory device is configured to suspend the memory refresh in response to receiving the refresh suspend command from the memory controller unit.

20. The system as in claim 16, wherein the memory device is further configured to perform the first refresh based on an internal temperature sensor while the memory controller unit is powered down.

* * * * *